(12) United States Patent
Curtis et al.

(10) Patent No.: US 10,939,587 B2
(45) Date of Patent: Mar. 2, 2021

(54) SYSTEM AND METHOD FOR INJECTING COOLING AIR INTO SERVERS IN A SERVER RACK

(71) Applicant: DELL PRODUCTS, L P, Round Rock, TX (US)

(72) Inventors: Robert Boyd Curtis, Georgetown, TX (US); Austin M. Shelnutt, Leander, TX (US)

(73) Assignee: Dell Products, L.P., Round Rock, TX (US)

( * ) Notice: Subject to any disclaimer, the term of this patent is extended or adjusted under 35 U.S.C. 154(b) by 360 days.

(21) Appl. No.: 15/434,946

(22) Filed: Feb. 16, 2017

(65) Prior Publication Data

US 2018/0235106 A1 Aug. 16, 2018

(51) Int. Cl.
*H05K 7/20* (2006.01)

(52) U.S. Cl.
CPC ..... *H05K 7/20736* (2013.01); *H05K 7/20145* (2013.01)

(58) Field of Classification Search
CPC ....... G06F 1/181–182; H05K 7/20218–20381; H05K 7/20409–20418; H05K 7/20009–202; H01L 23/367–3677; H01L 23/473; H01L 23/46–467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | | |
|---|---|---|---|---|
| 6,990,817 | B1 * | 1/2006 | Bhatia | F25B 9/04 62/259.2 |
| 7,751,186 | B2 * | 7/2010 | Moss | G06F 1/20 312/223.2 |
| 7,751,188 | B1 * | 7/2010 | French | H05K 7/20736 165/104.33 |
| 9,173,320 | B2 * | 10/2015 | Alshinnawi | H05K 7/20145 |
| 9,497,891 | B2 * | 11/2016 | Alvarado | H05K 7/20736 |
| 2003/0128513 | A1 * | 7/2003 | Wiley | G06F 1/183 361/695 |
| 2004/0185316 | A1 * | 9/2004 | Wells | H01M 8/04007 429/429 |
| 2004/0217072 | A1 * | 11/2004 | Bash | H05K 7/20718 211/26 |
| 2005/0159099 | A1 * | 7/2005 | Malone | F24F 3/044 454/186 |

(Continued)

*Primary Examiner* — Courtney L Smith
(74) *Attorney, Agent, or Firm* — Larson Newman, LLP

(57) ABSTRACT

A cooling system for a server rack may cool one or more servers and one or more components thereof. The cooling system may comprise an air mover, an air delivery manifold, and one or more injection ducts for the one or more servers. The air mover may be located in an air mover module positioned in the server rack and may generate a pressurized airflow. The air delivery manifold receives the pressurized airflow generated by the air mover, and may have delivery ports and provide a fluid path for airflow out of the delivery ports to the injection ducts. The injection ducts may be used to inject the airflow of cooling air into the servers to cool the servers and one or more components thereof.

20 Claims, 6 Drawing Sheets

(56) References Cited

U.S. PATENT DOCUMENTS

| | | | |
|---|---|---|---|
| 2005/0259392 A1* | 11/2005 | Vinson | G06F 1/20 361/679.47 |
| 2006/0019597 A1* | 1/2006 | Beitelmal | H05K 7/20727 454/184 |
| 2006/0168975 A1* | 8/2006 | Malone | F24F 11/001 62/180 |
| 2007/0074525 A1* | 4/2007 | Vinson | H05K 7/20745 62/259.2 |
| 2007/0139883 A1* | 6/2007 | Pinkerton, III | H01L 23/473 361/696 |
| 2007/0227708 A1* | 10/2007 | Hom | G06F 1/20 165/121 |
| 2007/0247809 A1* | 10/2007 | McClure | G06F 1/20 361/695 |
| 2008/0176503 A1* | 7/2008 | Stanimirovic | F24F 11/30 454/229 |
| 2008/0212282 A1* | 9/2008 | Hall | G06F 1/20 361/701 |
| 2008/0245083 A1* | 10/2008 | Tutunoglu | F25B 49/005 62/115 |
| 2009/0059523 A1* | 3/2009 | Mallia | F24F 11/053 361/695 |
| 2009/0150123 A1* | 6/2009 | Archibald | G06F 17/5004 703/1 |
| 2009/0260795 A1* | 10/2009 | Perazzo | H05K 7/20572 165/269 |
| 2009/0293518 A1* | 12/2009 | Bettella | F04D 25/12 62/186 |
| 2010/0317278 A1* | 12/2010 | Novick | H05K 7/20836 454/184 |
| 2011/0045759 A1* | 2/2011 | Rasmussen | H05K 7/20572 454/184 |
| 2011/0080701 A1* | 4/2011 | Bisson | H05K 7/20563 361/679.5 |
| 2011/0176271 A1* | 7/2011 | Zhang | G06F 1/20 361/679.33 |
| 2011/0228475 A1* | 9/2011 | Anderl | H05K 7/20727 361/691 |
| 2012/0113592 A1* | 5/2012 | Chen | H05K 7/1488 361/695 |
| 2013/0128455 A1* | 5/2013 | Koblenz | H05K 7/20836 361/692 |
| 2013/0170132 A1* | 7/2013 | Bellin | G06F 1/20 361/679.46 |
| 2013/0229768 A1* | 9/2013 | Doll | H05K 7/20736 361/679.46 |
| 2013/0295834 A1* | 11/2013 | Faist | H05K 7/20736 454/184 |
| 2014/0011437 A1* | 1/2014 | Gosselin | H05K 7/20836 454/154 |
| 2014/0146459 A1* | 5/2014 | Hazzard | G06F 1/16 361/679.21 |
| 2014/0190198 A1* | 7/2014 | Slessman | H05K 7/20745 62/314 |
| 2015/0036293 A1* | 2/2015 | Martini | F24F 11/0001 361/695 |
| 2015/0083363 A1* | 3/2015 | Lindenstruth | H05K 7/20745 165/47 |
| 2015/0090425 A1* | 4/2015 | Shelnutt | G06F 1/183 165/56 |
| 2015/0116929 A1* | 4/2015 | Shabbir | H05K 7/20736 361/679.48 |
| 2015/0184883 A1* | 7/2015 | Hamann | H05K 7/20836 700/277 |
| 2015/0305205 A1* | 10/2015 | Gonzalez | G06F 1/20 361/697 |
| 2016/0014932 A1* | 1/2016 | Best | H05K 7/20763 361/679.53 |
| 2016/0032868 A1* | 2/2016 | Khanapure | F02M 21/023 60/323 |
| 2016/0037687 A1* | 2/2016 | Stevens | G11B 33/142 361/679.31 |
| 2016/0066480 A1* | 3/2016 | Eckberg | H05K 7/20772 361/679.53 |
| 2016/0088774 A1* | 3/2016 | Alvarado | H05K 7/20736 361/679.46 |
| 2016/0128238 A1* | 5/2016 | Shedd | F25B 23/006 361/679.47 |
| 2016/0295748 A1* | 10/2016 | Desiano | H05K 7/20772 |
| 2017/0064874 A1* | 3/2017 | Lyon | H01L 23/473 |
| 2017/0181322 A1* | 6/2017 | Shelnutt | H05K 7/20663 |
| 2017/0318703 A1* | 11/2017 | Klein | H05K 7/20745 |
| 2017/0371385 A1* | 12/2017 | Leigh | H05K 7/1491 |
| 2018/0073763 A1* | 3/2018 | Afrakhteh | F24F 11/77 |
| 2018/0092254 A1* | 3/2018 | Shelnutt | H05K 7/20781 |
| 2018/0107180 A1* | 4/2018 | Slessman | B31C 9/00 |
| 2018/0119971 A1* | 5/2018 | Slessman | H05K 7/20745 |

* cited by examiner

SYSTEM AND METHOD FOR INJECTING COOLING AIR INTO SERVERS IN A SERVER RACK

FIELD OF THE DISCLOSURE

This disclosure generally relates to information handling systems, and more particularly relates to injecting cooling air into servers in a server rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A server may have a generally planar layout or configuration, and multiple servers may be stored in a server rack. A cooling system for the server rack may include an air mover, an air delivery manifold, and one or more injection ducts for the servers. The air mover may be located in an air mover module positioned in the server rack and may generate a pressurized airflow. The air delivery manifold receives the pressurized airflow from the air mover and may have delivery ports and provide a fluid path for airflow out of the delivery ports. The injection ducts may be used to inject the airflow of cooling air into the servers to provide cooling to the servers.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
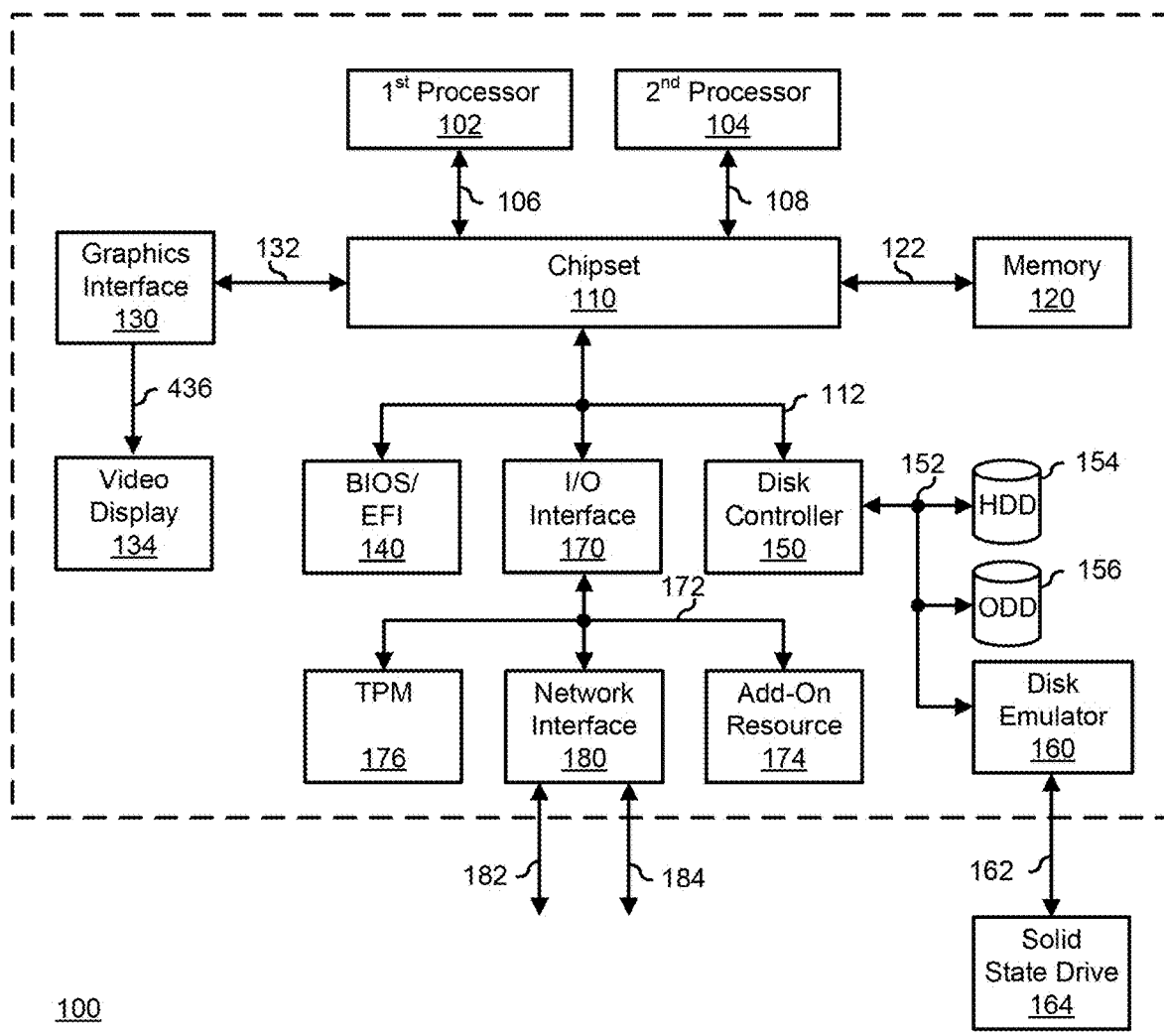
FIG. 1 is a block diagram illustrating a generalized information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to the chipset via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to a TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

An example of an information handling system is a server. A server may have a generally planar layout or configuration and multiple servers may be stored in a server rack. Servers in a server rack may have a power consumption and corresponding heat generation from processors, power supplies and other server components which may be detrimental to the operation of the servers such that the servers (and server components) may benefit from cooling. A server may generally be encapsulated in a server chassis which fits into a corresponding slot in the server rack. Multiple servers may be stored in a server rack and operate while stored in the server rack. The multiple servers may generate heat on an order to damage server components by overheating. The servers in a server rack may be air cooled to mitigate generated heat.

A server or server rack may have one or more cooling fans to generate one or more airflows for cooling components of the server. For example, one or more cooling fans may be components of a server and may generate airflows for cooling other components of the server. The cooling fans may be positioned in or on the server generally towards the front of the server to generate airflows across server components positioned to the rear of the server fans in or on the server.

Heating of air in an airflow moving over the server as part of cooling inherently constrains cooling of server components because the air may be heated during flow to an increased temperature rendering the air ineffective for cooling server components. For example, server components at the front and middle of a typical server such as disk storage, processors and memory, are cooled by airflow air as the airflow moves through the server chassis. This cooling transfers heat from these components to the air resulting in higher air temperatures in the airflow when the air arrives toward the rear of the server and encounters components positioned in the server. These higher air temperatures limit the cooling capability or require increased airflow velocities or flow rates to achieve sufficient cooling for rear server components (for example, busses, power supply units or rear storage devices). In some cases, server power or heat generation restrictions, or reduced ambient temperatures are required due to the high heat levels found in dense or high power server systems.

Thus, areas of a server may receive relatively heated air which may be relatively ineffective for cooling. Such areas of a server may be considered thermally challenged because such areas of the server receive relatively heated air for cooling components which may be inadequate for adequately cooling components positioned in the thermally challenged areas of the server.

Figure 2:
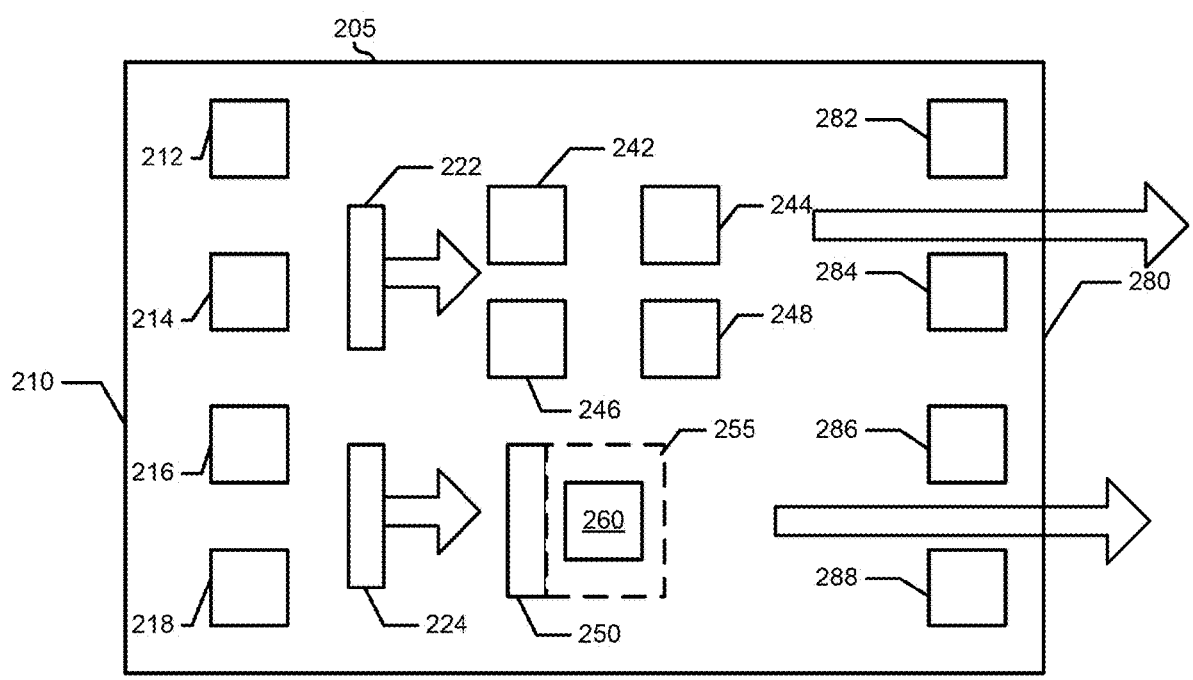
FIG. 2 is a top view of a layout of a server according to an embodiment of the present disclosure.

FIG. 2 shows a server 200 that includes server chassis 205 which defines a profile of the server 200 and encapsulates the server components of server 200. Server chassis 205 may fit into a corresponding slot or rack in a server rack (not shown). Server 200 has a front area 210 and a back area 280. Server front area 210 may include front components 212, 214, 216, and 218 positioned in the front area 210 of the server. Server back area 280 may include back components 282, 284, 286, and 288 positioned in back area 280 of the server.

Server 200 may include in situ cooling fans 222 and 224 which are positioned towards the front of the server, relatively close to front area 210 of the server such that cooling fans 222 and 224 may be considered to reside in the front area 210 (at least generally) of server 210. Sever cooling fans 222 and 224 may be operated to generate cooling airflows as shown by the arrows of FIG. 2. Cooling fans 222 and 224 may be positioned in the same general plane of server 200 as other components of server 200 such that the generated airflows flow over the subsequent components of server 200 as shown.

An airflow generated by cooling fan 222 may flow over components 242, 244, 246 and 248 positioned between front area 210 and back area 280, and components 242, 244, 246 and 248 may generate heat and require cooling such that the air in the airflow reaching back area 280 is relatively heated and may be inadequate for cooling back components 282, 284, 286 and 288 in back area 280 such that back area is thermally challenged. The air in the airflow may be adequate to adequately cool components 242, 244, 246 and 248.

A thermally challenged area of a server may be considered to be an area or component that does not receive a cooling airflow adequate to cool the area or component. For example, air in the airflow may have been heated by cooling and absorbing heat from preceding components such that the airflow does not adequately cool components in the thermally challenged area.

Thermally challenged areas may occur in a server layout between the front area and the back area of the server. For example, one or more obstructions may obstruct or divert airflow such that airflow may not adequately flow over areas immediately subsequent to the obstructions to provide adequate cooling such that those areas are thermally challenged. In server 200, obstruction 250 blocks airflow generated by cooling fan 224 over obstruction area 255, preventing adequate cooling of obstruction area 255 by airflow, causing obstruction area 255 to be thermally challenged. Thus, component 260 positioned in obstruction area 255 may not be adequately cooled by airflow from front area 210 to back area 280 because component 260 may receive little or no airflow due to obstruction 250.

To adequately cool server components positioned in thermally challenged areas of the server such as 255 and 280 of FIG. 2, an airflow may be injected into the thermally challenged areas of a server by an injection duct coupled to the server and positioned interior to the server chassis. This airflow may be in addition to the airflows provided by cooling fans 222 and 224 or server rack cooling fans which generate airflows which flow across a server to generally cool server components. In the context of a server rack storing multiple servers, an air delivery manifold may be coupled, for example, appended to the body of the server rack to provide an air delivery channel to each injection duct. In turn, an air mover may be coupled to the air delivery manifold to provide an airflow of cooling air to the air delivery manifold and the individual server injection ducts. The air mover may be a module located in dead space in the bottom of a server rack. A server rack may have one or more areas of dead space which are areas defined by the body of the server rack which are unoccupied by servers or other components of the server rack. Generally, the bottom of server rack is occupied by dead space which may be used by the air mover module.

Figure 3:
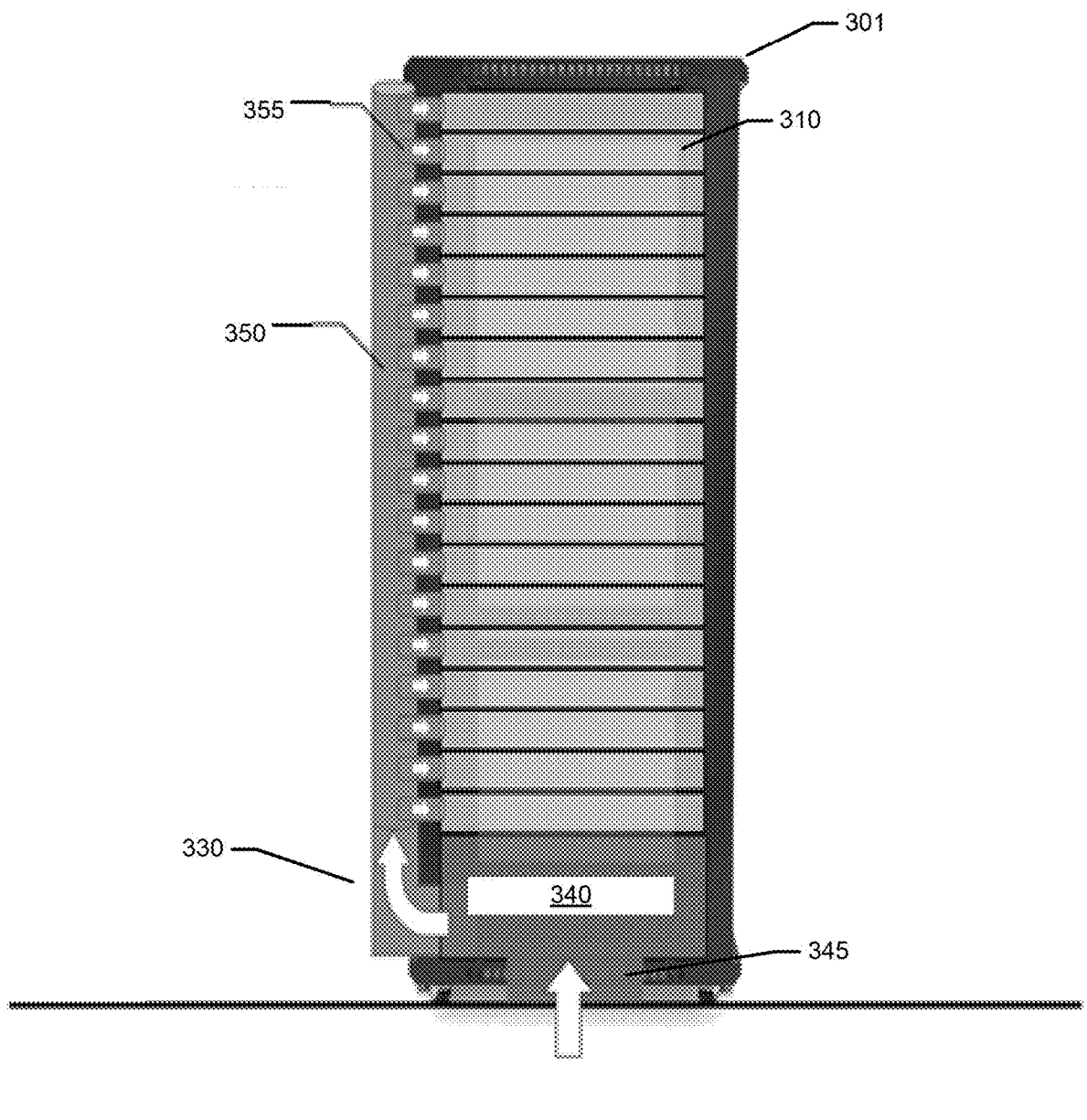
FIG. 3 illustrates a generalized embodiment of a server rack system according to an embodiment of the present disclosure.

FIG. 3 illustrates a generalized embodiment of a server rack system 300 with a server rack 301 storing servers and equipped with cooling system 330 for injecting airflow into the thermally challenged areas of the stored servers. FIG. 3 provides a front view of server rack system 300. Server rack system 300 includes server rack 301, servers 310, and cooling system 330. Cooling system 330 includes air mover module 340 and air delivery manifold 350, as well as injection ducts (not shown) positioned in servers 310. As can be seen from FIG. 3, server rack 301 sits on floor 302 and stores 18 servers in its racks. Appended to server rack 310 is cooling system 330, which, as shown, provides an airflow of cooling air to each of servers 310, namely the injection ducts (not shown). Interior to server rack 310 and located in dead space at the bottom of server rack 301 is air mover module 340. Air mover module 340 includes an air mover such as a high pressure blower or compressor, a speed control, and a monitoring circuit. Air mover module 340 also includes primary intake 345 which takes in air from the area of the floor. The coolest air may be in the area of the floor.

Air mover module 340 provides pressurized airflow of cooling air to air delivery manifold 350. The exhaust (not shown) of the air mover module 340 may be connected to air delivery manifold 350 to provide an airflow of cooling air to manifold 350. As shown by the front view of FIG. 3, air delivery manifold 350 is positioned vertically, and appended to a side of server rack 301 with 18 airflow delivery ports 355 for the 18 servers, one delivery port 355 per corresponding and respective server 310. Each delivery port 355 is coupled to the respective server injection duct (not shown) of the respective server 310 to direct the air of the airflow to thermally challenged area(s) of the server.

In a cooling operation of cooling system 330, air mover module 340 at the bottom of server rack 301 provides a pressurized airflow to air delivery manifold 350 with the airflow source being cool air from the floor area. Air mover module 340 may be considered to pressurize air to produce an airflow by compression. Arrows show the path of the airflow from the floor area into air mover module 340 via primary intake 345, into air delivery manifold 350 (via a secondary intake, not shown), and into the servers 310 via delivery ports 355. The airflow pressure is relatively greater than what is typically produced by cooling fans flowing air to air cool a server but is relatively lower than what is considered high pressure, which is generally on the order of 50-100 PSI.

Figure 4:
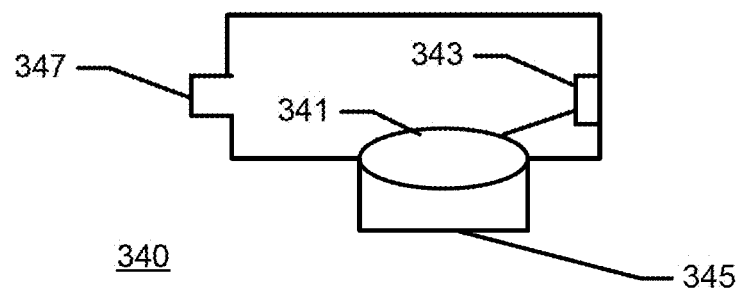
FIG. 4 illustrates a generalized embodiment of an air mover module according to an embodiment of the present disclosure.

FIG. 4 illustrates a generalized embodiment of air mover module 340 of FIG. 3. As shown, air mover module 340 may include a centrifugal fan 341 with, for example, a backward curved impeller for compressing air, a speed control and monitoring circuit 343, a primary intake 345, and an exhaust 347. Speed control and monitoring circuit 343 is coupled to centrifugal fan 341 to control operation of centrifugal fan 341. In operation, centrifugal fan 341 pulls air from primary intake 345 under control of speed control and monitoring circuit 343 to compress air to generate a pressurized airflow of air which exits air mover module 340 out exhaust 347. Thus, air mover module 340 may be considered an active component of the cooling system. Exhaust 347 may be coupled to a secondary intake of air delivery manifold 350 to deliver the pressurized airflow to delivery manifold 350.

Figure 5:
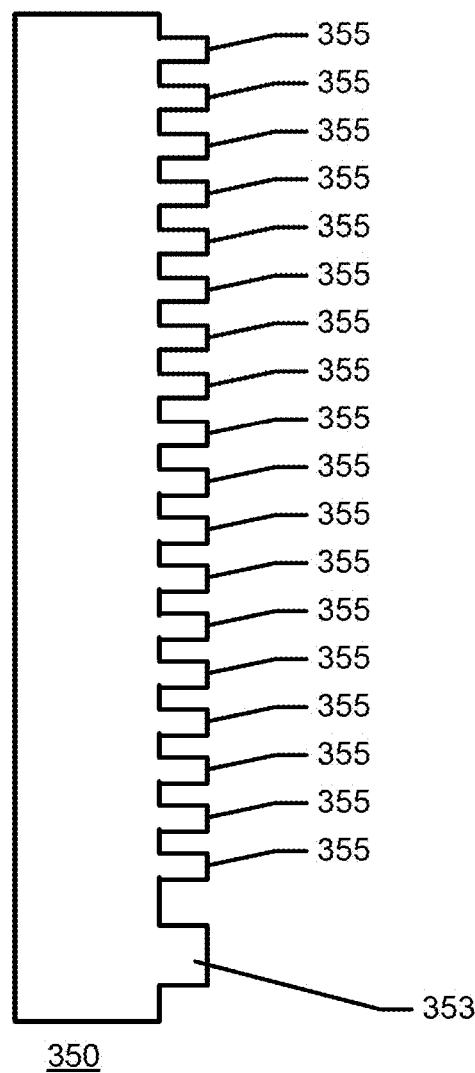
FIG. 5 illustrates a generalized embodiment of air delivery manifold according to an embodiment of the present disclosure.

FIG. 5 illustrates a generalized embodiment of air delivery manifold 350 of FIG. 3. Air delivery manifold 350 is hollow, comprises secondary intake 353 and delivery ports 355, and provides a fluid pathway from secondary intake 353 to delivery ports 355. The number of delivery ports 355 correspond to the number of servers potentially stored in the corresponding server rack. Secondary intake 353 is coupled to the exhaust of air mover module 340 to receive the pressurized airflow generated by air mover module 340. Air delivery manifold 350 thus receives an airflow of air for cooling from air mover module 340 and guides the airflow out of delivery ports 355 to deliver cooling airflows to each of the servers in the server rack. Air delivery manifold 350 may be considered to be a passive component of the cooling system because air delivery manifold 350 is static and lacks moving parts, serving as an airflow guide.

Delivery ports 355 may be closed by a valve or door until or unless the delivery port is coupled to a server chassis or injection duct. Installation of a server chassis may actuate a mechanism to open the delivery port door or valve to provide airflow into the injection duct of the server. Otherwise the valve or door of the delivery port 355 is closed to prevent leakage or wasted airflow through the delivery port. For example, each delivery port may have appended to it a door or vale that interfaces with a server chassis such that when a server chassis is installed in the server rack, the server chassis interfaces with the delivery port door or valve to open the door or valve to fluidly couple the injection duct of the server to the delivery port 355 to provide an airflow to the injection duct.

Interior to each server chassis, an injection duct distributes airflow from the air delivery manifold to one or more locations in the server, for example thermally challenged areas of the server. The injection duct provides a pathway and directs the airflow toward the thermally challenged areas. The injection duct minimizes the airflow impedance within the bounds of the server chassis so that a system or server airflow provided by system or server fans is unimpeded. An opening in the server chassis may connect or fluidly couple the air delivery manifold, namely the corresponding delivery port of the air delivery manifold, to the respective server injection duct. The injection ducts may be considered to be a passive components of the cooling system because the injection ducts are static and lack moving parts, serving as individual airflow guides.

Figure 6:
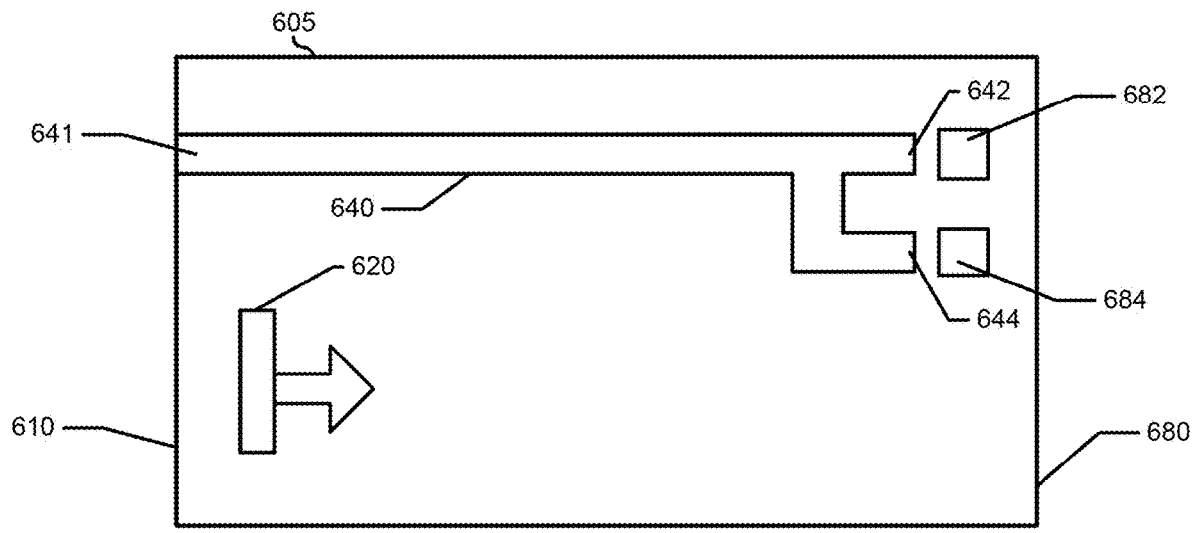
FIG. 6 illustrates a generalized embodiment of an injection duct according to an embodiment of the present disclosure.
Figure 7:
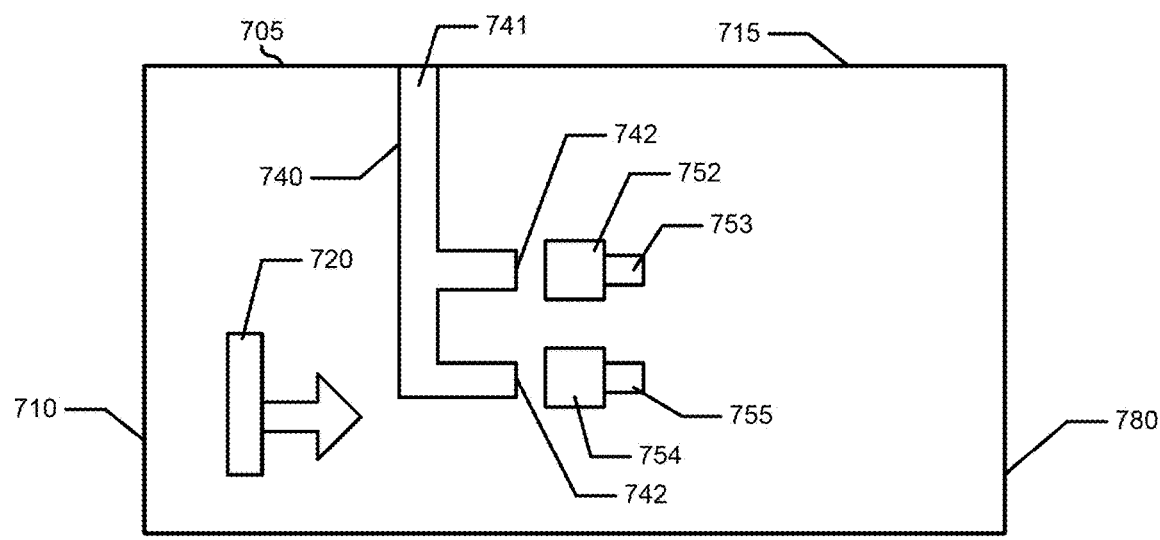
FIG. 7 illustrates a generalized embodiment of an injection duct according to an embodiment of the present disclosure.

FIGS. 6 and 7 illustrate generalized embodiments of injection ducts with different layouts in the context of servers and server components. FIG. 6 shows a server 600 that includes server chassis 605 which defines a profile of the server 600 and encapsulates the server components of server 600. Server 600 includes injection duct 640 interior to server chassis 605. Server 600 has a front area 610 and a back area 680. Server 600 includes components 682 and 684 which may be server power supply units (PSUs) for server 600. Components 682 and 684 are located proximate to back area 680 and as such may receive relatively warmed airflow from server or system fans and as such are positioned in a thermally challenged area of sever 600.

For example, in situ server cooling fan 620, located generally in front area 610, may provide an airflow which does not adequately cool or reach components 682 and 684.

Injection duct 640 is hollow, includes input 641 and outputs 642 and 644, and provides a fluid path from input 641 to outputs 642 and 644. Injection duct 640 receives an airflow of air from a corresponding delivery port of the air delivery manifold at input 641 and directs the airflow of air to server components 682 and 684 via corresponding outputs 642 and 644, respectively, as shown in FIG. 6. Input 610 may be considered to be at a proximate end of injection duct 640 and outputs 642 and 644 may be considered to be at a distal end of injection duct 640. The injection of cool air over components 682 and 684 aid in achieving better cooling (lower temperature) of components 682 and 684. If components 682 and 684 are PSUs, they can support an increased power density due to the lower temperature design point provided by the fresh air injection of injection duct 640.

FIG. 7 shows a server 700 that includes server chassis 705 which defines a profile of the server 700 and encapsulates the server components of server 700. Server 700 may include server cooling fan 720 which generates a cooling airflow as shown. Server 700 includes injection duct 740 interior to server chassis 705. Injection duct 740 may provide cooling to supplement the cooling provided by cooling fans such as cooling fan 720. Server 700 has a front area 710 and a back area 780. Server 700 includes components 753 and 755 which may be central processing units (CPUs) for server 700. Server 700 further includes components 752 and 754 which may be CPU heat sinks for corresponding CPUs 753 and 755, respectively. Components 752, 753, 754 and 755 are located central to server 700. CPU 753 abuts corresponding heat sink 752, allowing heat sink 752 to sink heat generated by CPU 753. CPU 755 abuts corresponding heat sink 754, allowing heat sink 754 to sink heat generated by CPU 755.

As shown in FIG. 7, injection duct 740 receives an airflow as input from a side of server chassis 705. That is, input 741 of injection duct 740 abuts the side (715) of server chassis 705 to receive an airflow from a delivery port of an air delivery manifold appended to a corresponding side of the server rack storing the server chassis. An air delivery manifold appended to a side of a server rack is a non-limiting example appending of an air delivery manifold, and an air delivery manifold may be appended to the front or back of a server rack in varying embodiments.

Injection duct 740 is hollow, includes input 741 and outputs 742 and 744, and provides a fluid path from input 741 to outputs 742 and 744. Injection duct 740 receives an airflow of air from a corresponding delivery port of the air delivery manifold at input 741 and directs the airflow of air to server components 752 and 754 via corresponding outputs 742 and 744, respectively, as shown in FIG. 7. The injection of cool air over components 752 and 754 aid in achieving better cooling (lower temperature) of components 752 and 754. If components 752 and 754 are heat sinks for corresponding CPUs, as described, the injection of cool air will aid in achieving better cooling (lower temperature) of the heat sinks, and thus the corresponding CPUs. As a result, it may be possible to use higher power CPUs or CPUs with a lower temperature requirement in server 700.

While in FIG. 3, the air delivery manifold is appended to the side of the server rack, this is by way of example, and the air delivery manifold may be appended to the sides, front, or back of the server rack. In further embodiments, the air delivery manifold may be located in dead space of the server rack such that the air cooling system is enclosed within the profile of the server rack.

Figure 8:
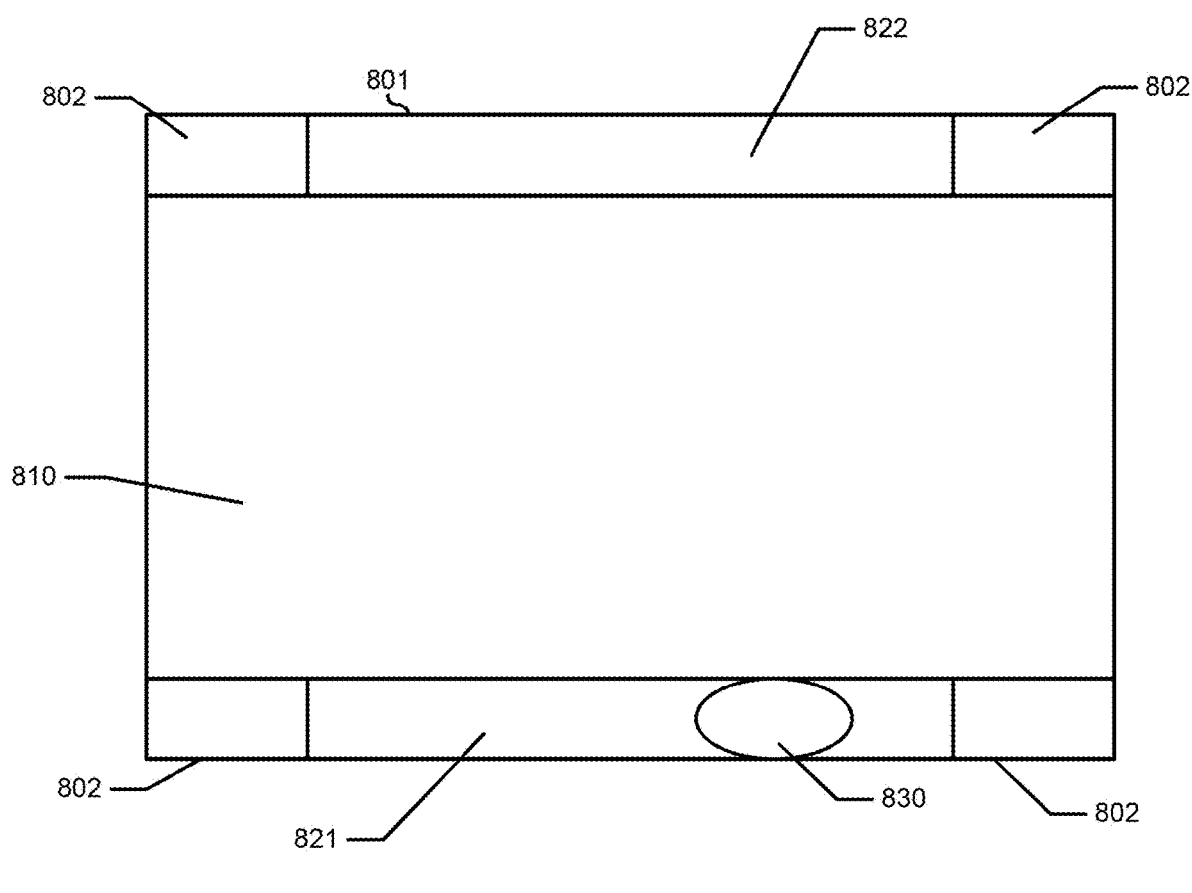
FIG. 8 is a top view of a generalized layout of a server rack system according to an embodiment of the present disclosure.

FIG. 8 is a top view of a server rack 800 with an air delivery manifold located in server rack dead space. Server rack 800 has an internal area defined by body 801 of server rack 800. Server rack 800 further includes frame elements 802 supporting frame body 801. Frame elements have a volume that defines server storage space 810 for storing servers and dead spaces 821 and 822 interior to body 801 of server rack 800. As shown in FIG. 8, air delivery manifold 830 is located in dead space 821 and as such, the cooling system may be enclosed within the profile of body 801 of server rack 800.

It may be necessary to utilize the entire dead space on one side of the rack (or both) for the air delivery manifold in order to minimize the pressure losses within the manifold. When the air delivery manifold is located in dead space interior to a server rack body, a server chassis may be equipped with a sliding door to open up an opening in the server chassis to allow for an injection duct of the associated server to fluidly couple to an air delivery port of the air delivery manifold.

Power supply density limits may be limited by the inlet air temperature boundary conditions (typically 55° C.). Lower temperatures at the rear of the chassis allow for increased system density and feature set. CPU cooling can also be improved if the inlet temperature to the CPU heatsink is reduced. Power supplies typically consume approximately 15 cubic feet per minute of airflow at maximum fan speed with a design boundary condition of 55° C. inlet temperature to the PSU. Suppose embodiments described herein provide 5 cubic feet per minute at 25° C. to each PSU. The injected 25° C. air will mix with the 55° C. airflow and result in an equivalent cooling temperature of 45° C. This 10° C. reduction in PSU cooling temperature will allow for an increased power density due to the lower inlet temperature.

Embodiments address preheated cooling air by injecting additional cooling air into the server in specific areas exposed to higher levels of heating or in areas that are thermally challenged. Embodiments disclosed herein may augment the normal server airflow system utilized for cooling. Thus, in embodiments, server fans are not removed or replaced. Embodiments described herein deliver cooling air to server components such as PSUs, expansion slots, and graphics cards. Embodiments described herein allow for cooling air to be provided directly to the processor heatsink to aid in cooling higher power or lower temperature requirement CPUs.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A cooling system for a server in a server rack, comprising:
    an air mover module to generate a pressurized airflow, the air mover module located in dead space of the server rack and external to the server, the air mover module including a centrifugal fan receiving air from a bottom of the server rack;
    an air delivery manifold with a first delivery port and configured to receive the pressurized airflow from the air mover module, wherein the air delivery manifold provides a fluid path for the pressurized airflow, wherein the fluid path is enclosed between the air mover module and the first delivery port; and
    a first injection duct for a first server, the first injection duct encapsulated by a chassis of the server and configured to be fluidly coupled to the first delivery port to receive the pressurized airflow, the first injection duct having a distal end to direct the pressurized airflow to cool a component within the server.

2. The cooling system of claim 1, wherein the first delivery port is coupled to an input of the first injection duct through an opening in the server chassis.

3. The cooling system of claim 1, wherein the air mover module includes an air mover and a control circuit, wherein the control circuit is configured to control the air mover.

4. The cooling system of claim 3, wherein the air mover module includes a primary intake and an exhaust configured to couple to the air delivery manifold, wherein the air mover pulls air from the primary intake and compresses the air to provide the pressurized airflow out of the exhaust to the air delivery manifold.

5. The cooling system of claim 3, wherein the air mover is a compressor and includes a fan for generating the pressurized airflow.

6. The cooling system of claim 1, wherein the dead space is located at the bottom of the server rack storing the server.

7. The cooling system of claim 4, wherein the air delivery manifold includes a secondary intake and a set of delivery ports, the set of delivery ports including the first delivery port, wherein the air delivery manifold is hollow to provide the fluid path between the secondary intake and the set of delivery ports.

8. The cooling system of claim 4, wherein the air delivery manifold includes a secondary intake configured to couple to the exhaust to receive the airflow.

9. The cooling system of claim 1, wherein the air delivery manifold is appended to a body of the server rack storing the server.

10. The cooling system of claim 9, wherein the air delivery manifold is positioned in dead space of the server rack such that the air delivery manifold is encapsulated in the body.

11. The cooling system of claim 1, wherein the first injection duct includes an input and a first output and provides a path for airflow between the input and the first output and the input is configured to be coupled to the first delivery port.

12. The cooling system of claim 11, wherein the first output terminates in a vicinity of a thermally challenged area of the server to provide an airflow to the thermally challenged area.

13. The cooling system of claim 11, wherein the first output terminates in a vicinity of a component of the server to provide an airflow to the component.

14. A server rack comprising:
- an air mover module to generate a pressurized airflow, the air mover module including a centrifugal fan receiving air from a bottom of the server rack, wherein the air mover module is located within the server rack and external to first and second servers of the server rack;
- an air delivery manifold having a first delivery port and fluidly coupled to the air mover module to receive the pressurized airflow from the air mover module, wherein the air delivery manifold provides a fluid path for the pressurized airflow, wherein the fluid path is enclosed between the air mover module and the first delivery port; and
- a first injection duct encapsulated by a server chassis of the first server and configured to be fluidly coupled to the first delivery port to receive the pressurized airflow from the fluid path, wherein the first injection duct directs the pressurized airflow to a component location within the first server.

15. The server rack of claim 14, wherein the first delivery port is coupled to an input of the first injection duct through an opening in the server chassis.

16. The server rack of claim 14, wherein the air mover module is located in a bottom dead space of the server rack, the bottom dead space located in a bottom area of the server rack proximate a floor supporting the server rack.

17. The server rack of claim 16, wherein the air mover module includes an air mover, a primary intake and an exhaust configured to couple to the air delivery manifold, wherein the air mover pulls air from the primary intake and compresses the air to provide the pressurized airflow out of the exhaust to the air delivery manifold.

18. The server rack of claim 17, wherein the air delivery manifold includes a secondary intake and a set of delivery ports, the set of delivery ports comprising the first delivery port, wherein the air delivery manifold is hollow to provide the fluid path between the secondary intake and the set of delivery ports and the secondary intake is coupled to the exhaust to receive the pressurized airflow.

19. The server rack of claim 18, wherein the air delivery manifold is positioned in dead space of the server rack such that the air delivery manifold is encapsulated in a body of the server rack.

20. A method of cooling a server stored in a rack, the method comprising:
- compressing air from a primary intake at an air mover module to provide an airflow of compressed air out of an exhaust, the air mover module located within the server rack and external to the server, the air mover module including a centrifugal fan receiving air from a bottom of the server rack;
- receiving the airflow from the exhaust at a secondary intake of an air delivery manifold that provides a fluid path to a delivery port;
- receiving the airflow of compressed air at an input of an injection duct for the server from the first delivery port; and
- outputting the airflow from an output of the injection duct, the output proximate a thermally challenged area of the server.

* * * * *